United States Patent [19]

Koike

[11] Patent Number: 4,982,380

[45] Date of Patent: Jan. 1, 1991

[54] SEMICONDUCTOR MEMORY DEVICE HAVING OUTPUT DATA BUFFER UNIT SHARED BETWEEN USUAL ACCESS MODE AND TEST MODE OF OPERATION

[75] Inventor: Hiroyuki Koike, Tokyo, Japan

[73] Assignee: NEC Corporation, Tokyo, Japan

[21] Appl. No.: 484,330

[22] Filed: Feb. 26, 1990

[30] Foreign Application Priority Data

Feb. 27, 1989 [JP] Japan .................................. 64-45825

[51] Int. Cl.⁵ ............................................ G11C 29/00
[52] U.S. Cl. ................................. 365/201; 365/189.05;
371/21.1
[58] Field of Search ........................... 365/201, 189.05;
371/21.1

[56] References Cited

U.S. PATENT DOCUMENTS

3,944,800  3/1976  Beck et al. ........................... 365/201
4,481,627 11/1984  Beauchesne et al. ............... 371/21.1
4,881,200 11/1989  Urai ................................. 365/189.05

Primary Examiner—James W. Moffitt
Attorney, Agent, or Firm—Sughrue, Mion, Zinn, Macpeak & Seas

[57] ABSTRACT

For decreasing a semiconductor chip where a semiconductor memory device is fabricated, a memory cell unit and a diagnostic unit are coupled to an output buffer unit through a single data path, and an auxiliary gate control unit is provided in association with the output buffer unit for shifting an output data pin between a high level, a low level and a high impedance state, in which the diagnostic unit checks a plurality of data bits from the memory cell unit to see whether or not the data bits are consistent with one another for producing a first diagnostic signal of either high or low level in a basic testing function but for producing second and third diagnosis signals for shifting the output data pin between the high and low levels and a high impedance state, in which the auxiliary gate control unit steers the output buffer unit in response to the first diagnosis signal or the third diagnosis signal on the single data path but the second diagnosis signal causes the auxiliary gate control unit to steer the output buffer unit for the high impedance state.

16 Claims, 10 Drawing Sheets

SEMICONDUCTOR MEMORY DEVICE HAVING OUTPUT DATA BUFFER UNIT SHARED BETWEEN USUAL ACCESS MODE AND TEST MODE OF OPERATION

FIELD OF THE INVENTION

This invention relates to a semiconductor memory device and, more particularly, to an output data buffer unit shared between a usual access mode and a test mode of operation.

DESCRIPTION OF THE RELATED ART

Figure 1:
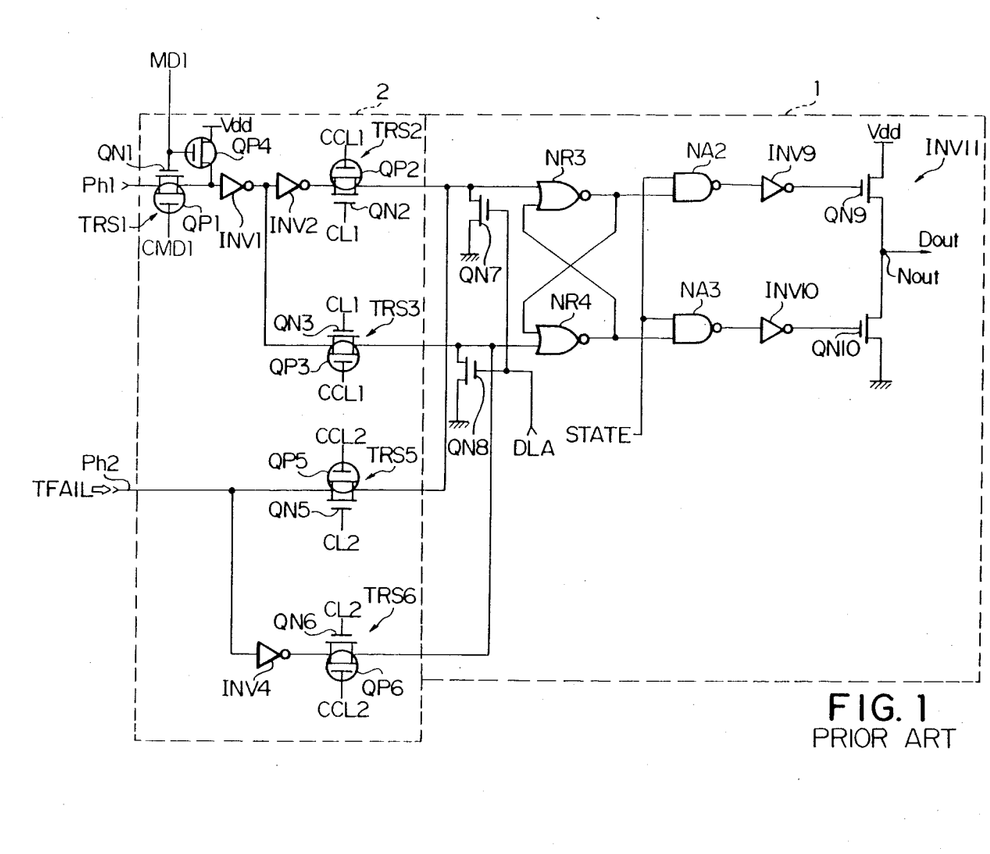
FIG. 1 is a circuit diagram showing the arrangement of the prior art output data buffer unit.

A typical example of the output data buffer unit is illustrated in FIG. 1 of the drawings and largely comprises an output data buffer circuit 1 and a multiplexer 2. The output data buffer unit is shared between a usual access mode and a test mode of operation, and the multiplexer 2 is coupled to two data signal paths Ph1 and Ph2. The first data signal path Ph1 propagates a data signal carrying a data bit read out from the memory cell array in the usual access mode of operation, and the second data path Ph2 is used in the test mode of operation.

The first data path Ph1 is coupled to a transfer gate TRS1 consisting of a p-channel type field effect transistor QP1 and an n-channel type field effect transistor QN1, and the transfer gate TRS1 is coupled to a series combination of inverter circuits INV1 and INV2. The inverter circuits INV1 and INV2 are respectively coupled at the output nodes thereof to transfer gates TRS2 and TRS3, and each of the transfer gates TRS2 and TRS3 is implemented by a parallel combination of an n-channel type field effect transistor QN2 or QN3 and a p-channel type field effect transistor QP2 or QP3. Between a source of positive voltage level Vdd and the input node of the inverter circuit INV1 is coupled a p-channel type field effect transistor QP4 which supplies the positive voltage level Vdd to the inverter circuit INV1 in the absence of a mode shifting signal MD1 indicative of the test mode of operation (or in a low voltage level). However, If the mode shifting signal MD1 goes up to a high voltage level, the p-channel type field effect transistor QP4 turns off, and the transfer gate TRS1 becomes conductive because the mode shifting signal MD1 and the complementary signal thereof CMD1 are respectively supplied to the n-channel type and p-channel type field effect transistors QN1 and QP1.

Figure 2:
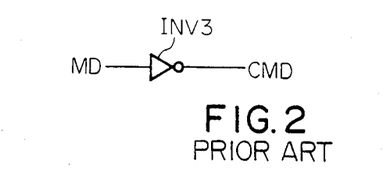
FIG. 2 shows an inverter circuit associated with the prior art output data buffer unit for producing the complementary mode signal.

For producing the complementary mode shifting signal CMD an inverter circuit INV3 (shown in FIG. 2) is provided in association with the multiplexer 2. The n-channel type field effect transistors QN2 and QN3 are supplied with a first clock signal CL1, and the complementary clock signal CCL1 is supplied to the p-channel type field effect transistors QP2 and QP3.

The second data path Ph2 is directly coupled to a transfer gate and is further coupled through an inverter circuit INV4 to a transfer gate TRS6, and each of the transfer gates TRS5 and TRS6 is implemented by a parallel combination of a p-channel type field effect transistor QP5 or QP6 and an n-channel type field effect transistor QN5 or QN6 as similar to another transfer gate. The n-channel type field effect transistors QN5 and QN6 are supplied with a second clock signal CL2, and the complementary signal CCL2 is supplied to the p-channel type field effect transistors QP5 and QP6. The first or second clock signal CL1 or CL2 and the complementary signal thereof are produced by a timing generating unit 3 shown in FIG. 3, and the timing generating unit 3 comprises four inverter circuits INV5, INV6, INV7 and INV8, a NAND gate NA1 and two NOR gates NR1 and NR2. A function signal TOIZ indicative of either basic testing function or three state testing function is fed to the inverter circuit INV5, and the function signal TOIZ of the low voltage level is indicative of the basic testing function, but the function signal TOIZ of the high voltage level is indicative of the three state testing function. In the basic testing function, a diagnostic unit (see FIG. 4) is expected to examine a plurality of data bits simultaneously read out from a memory cell array (not shown) and to produce a diagnosis signal TFAIL. If all of the data bits are identical in logic level with one another, the diagnosis signal TFAIL is shifted to the low voltage level, however, the diagnosis signal TFAIL remains in the high voltage level in so far as at least one data bit is different from the other data bits. The diagnosis signal TFAIL is used for an output data signal Dout of either high or low voltage level. On the other hand, when the semiconductor memory device is established in the three state testing function, the output data signal Dout of either high or low voltage level is indicative of consistency of the logic level in either high or low level; however, if at least one data bit is different from the other data bits, such an inconsistency is represented by the high impedance state of the output node Nout. The function signal TOIZ thus indicative of either basic or three state testing function is fed to the inverter circuit INV5, and the inverter circuit INV5 yields the complementary function signal CTOIZ.

Figure 3:
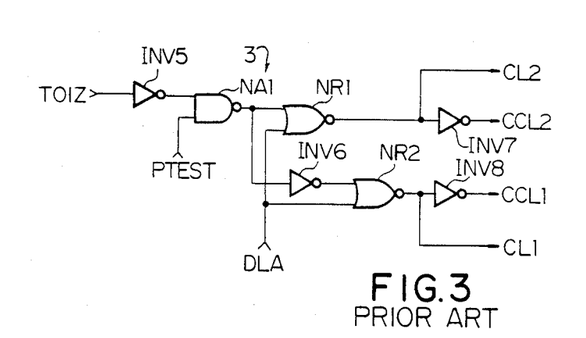
FIG. 3 is a logic diagram showing the arrangement of a timing generating unit associated with the prior art output data buffer unit.

A testing signal PTEST is fed to the NAND gate NA1, and the NAND gate NA1 produces an output signal of either high or low voltage level in the presence of the testing signal PTEST of the high voltage level; however, the output signal of the NAND gate NA1 is fixed to the high voltage level in the absence of the testing signal PTEST. If the NAND gate NA1 produces the output signal of the high voltage level, the NOR gate NR1 never responds to a timing control signal DLA, and the second clock signal CL2 and the complementary signal thereof CCL2 are respectively fixed to the low and high voltage levels. The second lock signal CL2 of the low voltage level and the complementary signal thereof allows the transfer gates TRS5 and TRS6 to forcibly turn off, so that no diagnosis signal TFAIL reaches the output data buffer circuit 2. The output signal of the high voltage level is further fed to the inverter circuit INV6, and the inverter circuit INV6 supplies the low voltage signal to the NOR gate NR2, so that the NOR gate NR2 is responsive to the timing clock signal DLA for producing the first clock signal CL1 and the complementary signal thereof. The first clock signal CL1 and the complementary signal thereof allow the transfer gates TRS5 and TRS6 to relay the data signal produced in the usual access mode of operation. However, if the testing signal PTEST of the high voltage level is fed to the NAND gate NA1, the NAND gate NA1 yields the output signal of the low voltage level, and the output signal of the low voltage level is causative of producing the second clock signal CL2 and the complementary signal thereof CCL2 for the transfer gates TRS5 and TRS6 but of isolating the output data buffer circuit 1 from the data signal fed from a memory cell in the usual mode of operation.

Turning back to FIG. 1 of the drawings, the output data buffer circuit 1 comprises two discharging transistors of the n-channel type QN7 and QN8, two NOR gates NR3 and NR4, two NAND gates NA2 and NA3 and three inverter circuits INV9, INV10 and INV11. Since the first or second clock signal CL1 or C12 is complementarily altered between the high and low voltage level with respect to the timing clock signal DLA, the discharging transistors QN7 and QN8 and the transfer gates TRS2, TRS3, TRS5 and TRS6 are also complementarily shifted between the on and off states. This means that the data signal or the diagnosis signal TFAIL surely reaches the NOR gates NR3 and NR4 through the transfer gates TRS2 and TRS3 or TRS5 and TRS6. However, while the transfer gates TRS2 to TRS6 are turned off, the previous data signal or the previous diagnosis signal TFAIL is forcibly discharged through the discharging transistors QN7 and QN8 to the ground. The output nodes of the NOR gates NR3 and NR4 and the input nodes thereof are coupled in a crossing manner, the NOR gates NR3 and NR4 produce and retain control signals opposite in voltage level to each other, and the control signals are fed in parallel to the NAND gates NA2 and NA3. A state control signal STATE is further supplied to the NAND gates NA2 and NA3, and the output signals thereof in turn are fed through the inverter circuits INV9 and INV10 to the output inverter circuit INV11 consisting of two n-channel type field effect transistors QN9 and QN10.

Figure 4:
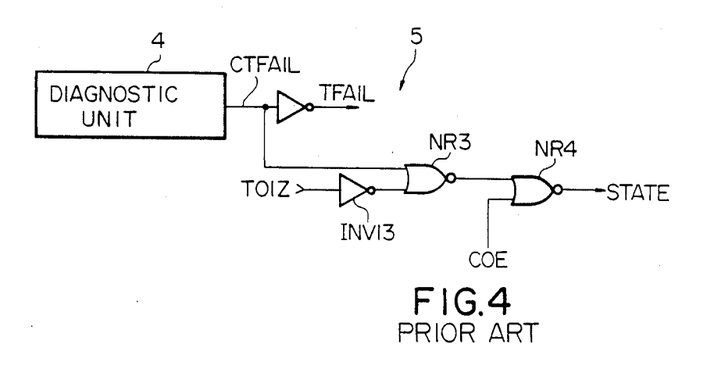
FIG. 4 is a logic diagram showing the arrangement of a state control unit incorporated in the prior art output data buffer unit.

As described hereinbefore, the prior art output data buffer circuit INV11 is established in the testing mode of operation for achievement of either basic or three state testing function, and a state control unit 5 is provided in association with the output data buffer unit shown in FIG. 4. When the three state testing function is selected, the function signal TOIZ is shifted into the high voltage level, and the inverter circuit INV13 activates the NOR gate NR3. The complementary output enable signal COE periodically activates the NOR gate NR4. Then, the complementary diagnosis signal CTFAIL indicative of the high impedance state causes the NOR gate NR3 to produce the output signal of high voltage level which in turn allows the NOR gate NR4 to yield the state control signal STATE of the low voltage level. With the state control signal STATE of the low voltage level, the NAND gates NA2 and NA3 simultaneously produces the output signals of the high voltage level regardless of the control signals fed from the NOR gates NR3 and NR4, and the inverter circuits INV9 and INV10 force the n-channel type field effect transistors QN9 an QN10 to turn off. Thus, both of the n-channel type field effect transistors QN9 and QN10 are simultaneously turned off, the output node Nout enters the high impedance state.

However, if the state control signal remains in the high voltage level, the NAND gates NA2 and NA3 are responsive to the control signals fed from the NOR gates NR3 and NR4 produces the output signals opposite in voltage level to each other depending upon the data signal or the diagnosis signal TFAIL. The output signals of the NAND gates NA2 and NA3 are supplied through the inverter circuits INV9 and INV10 to the n-channel type field effect transistors QN9 and QN10, and, for this reason, the n-channel type field effect transistors QN9 and QN10 are complementarily shifted between the on and off states, thereby producing an output data signal Dout of either high or low voltage level at the output node Nout.

The prior art output data buffer unit thus arranged is responsive to either data or diagnostic signal, but the fist and second data paths Ph1 and Ph2 are needed to propagate the data signal and the diagnosis signal, respectively. Such dual signal paths not only consume a large amount of real estate of a semiconductor substrate but also make the circuit arrangement complicate. For example, the complicate multiplexer 2 is incorporated in the output data buffer circuit, and the complicate timing generating unit 3 and the state control unit 5 are provided for the clock and control signals CL1, CL2 and STATE. These units further consumes a large amount of the real estate, so that the semiconductor substrate tends to be enlarged with the integration density of the memory cell array.

SUMMARY OF THE INVENTION

It is therefore an important object of the present invention to provide an output data buffer unit which is simple in the circuit arrangement.

To accomplish the above mentioned object, the present invention proposes to provide a single signal path associated with an auxiliary gate control unit and shared between a usual access mode and a diagnostic mode of operation.

In accordance with the present invention, there is provided a semiconductor memory device fabricated on a single semiconductor chip and having a usual access mode and a testing mode of operation, comprising: (a) a memory cell unit storing a plurality of data bits one of which is read out in the usual access mode of operation and plural bits of which are read out in the testing mode of operation. (b) a diagnostic unit activated in the testing mode of operation and achieving a basic testing function and a three state testing function, the diagnostic unit producing a first diagnosis signal of a first level when the plural data bits are consistent with one another in the basic testing function, the first diagnosis signal being shifted to a second level when at least one of the plural data bits is different from the other data bits, the diagnostic unit further producing a second diagnostic signal of either first or second level in the three state testing function when the plural data bits are consistent with one another in the first or second level, the diagnostic unit further producing a third diagnosis signal of the second level in the three state testing function when at least one of the plural data bits is different from the other data bits; (c) an output data buffer unit coupled to an output data pin and causing the output data pin to shift between the first level and the second level depending upon the data bit in the usual access mode or upon the first diagnosis signal, the output data buffer circuit further causing the output data pin to shift between the first level, the second level and a high impedance state depending upon a combination of the second and third diagnosis signals; (d) a single data path coupled between the memory cell unit, the diagnostic unit and the output data buffer unit for propagating the data bit in the usual access mode and the third diagnostic signal in the testing mode for achieving the three state testing function; (e) a controlling unit supplied with the first and second diagnostic signals and with other external control signals and producing a blocking signal and first and second three state controlling signals; (f) a transfer gate intervening in the single data path and turning off in the presence of the blocking signal in the testing mode for achievement of the basic testing mode, the transfer gate turning on in the usual access mode and in the testing mode for achieving the three state testing function; and (g) an auxiliary gate control unit responsive to the first and second state controlling signals and forcibly steering the output data buffer circuit in the testing mode for shifting the output data pin.

BRIEF DESCRIPTION OF THE DRAWINGS

The features and advantages of a semiconductor memory device having an output data buffer unit according to the present invention will be more clearly understood from the following description taken in conjunction with the accompanying drawings in which.

DESCRIPTION OF THE PREFERRED EMBODIMENTS

First Embodiment

Figure 5:
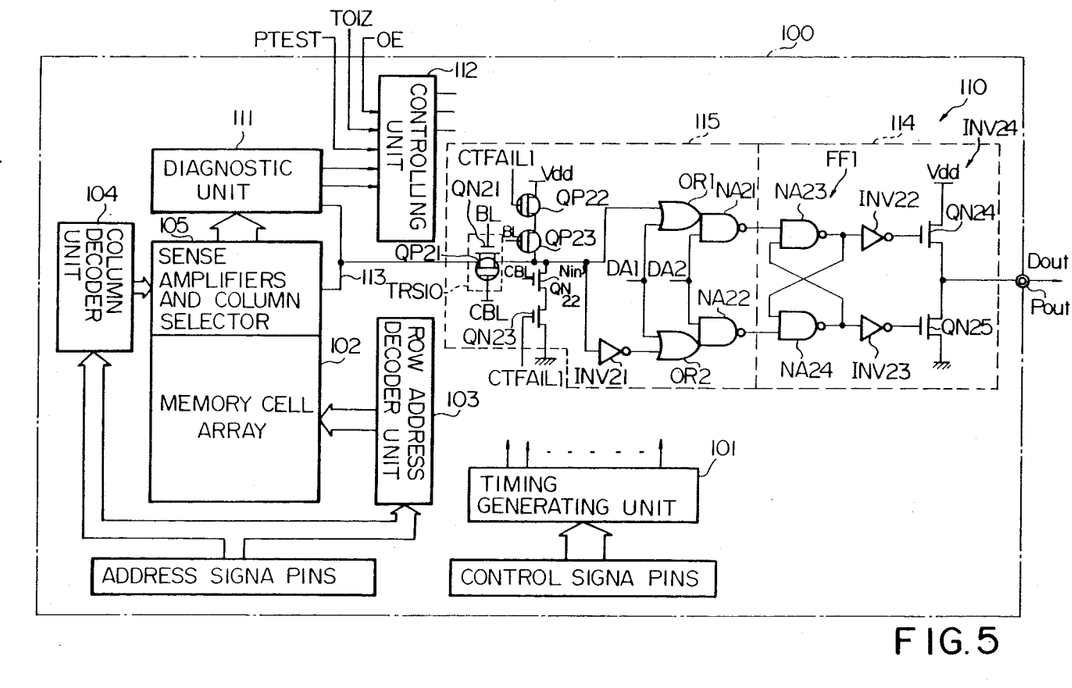
FIG. 5 is a circuit diagram showing the arrangement of a semiconductor memory device embodying the present invention.

Referring to FIG. 5 of the drawings, a semiconductor memory device embodying the present invention is fabricated on a single semiconductor chip 100 and largely comprises a timing generating unit 101, a memory cell array 102, a row address decoder unit 103, a column address decoder unit 104, a combined unit of sense amplifiers and a column selector 105; however, such component units 101 to 105 are well known in the art, so that no further description is incorporated hereinbelow. The semiconductor memory device is shiftable between a usual access mode and a testing mode of operation as similar to the prior art semiconductor memory device.

The semiconductor memory device further comprises an output data buffer unit 110, a diagnostic unit 111 and a controlling unit 112, and the diagnostic unit 111 achieves two different functions, i.e., a basic testing function and a three state testing function. In the basis testing function, the diagnostic unit 111 produces a first diagnosis signal TFAIL1 of a low voltage level indicative of coincidence of a plurality of data bits read out from the memory cell array 102 or of a high voltage level indicative of at least one data bit different in logic level from the other data bits. The first diagnosis signal TFAIL1 of either logic level results in an output data signal Dout of either voltage level. If the three state testing function is carried out on a plurality of data bits concurrently read out from the memory cell array 102, the high impedance state at an output data pin Pout is indicative of at least one data bit different in the logic level from the other data bits, but the coincidence in either logic level is indicated by an output data signal Dout of either voltage level as similar to the prior art output data unit. In the three state testing function, the diagnostic unit 111 produces second and third diagnosis signals TFAIL2 and TFAIL3.

The output data buffer unit 110 is accompanied with a single data path 113 extending from the combined circuit of sense amplifiers and column selector 105, and comprises a transfer gate TRS10 consisting of a p-channel type field effect transistor QP21 and an n-channel type field effect transistor QN21, an output data buffer circuit 114 and an auxiliary gate controlling circuit 115 intervening between the single data path 113 and the output data buffer circuit 114. The n-channel type field effect transistor QN21 is gated by a blocking signal BL produced by the controlling unit 112, and the p-channel type field effect transistor QP21 is shifted by the complementary signal CBL of the blocking signal. The output data buffer circuit 114 comprises a flip flop circuit FF1 consisting of two NAND gates NA23 and NA24 coupled in a crossing manner, two inverter circuits INN22 and INV23 respectively coupled to the NAND gates NA23 and NA24 and an output inverter circuit INV24 implemented by a series combination of two n-channel type field effect transistors QN24 and QN25 coupled between the source of positive voltage level Vdd and the ground node. The output data buffer circuit 114 thus arranged retains a data bit represented by a combination of an output data signal and the complementary signal thereof, and complementarily shifts the n-channel type field effect transistors QN24 and QN25 of the output inverter circuit INV24 through the inverter circuits INV22 and INV23.

The auxiliary gate controlling circuit 115 comprises a first series combination of two p-channel type QP22 and QP23, a second series combination of two n-channel type field effect transistors QN22 and QN23, an inverter circuit INV21, two OR gates OR1 and OR2 and two NAND gates NA21 and NA22. The first series combination is coupled between the source of positive voltage level Vdd and the single data path 113, and the second series combination is coupled between the single data path 113 and the ground node. The p-channel type field effect transistor QP22 and the n-channel type field effect transistor QN23 are gated by the first or second diagnosis signal TFAIL1 or TFAIL2, but the p-channel type field effect transistor QP23 and the n-channel type field effect transistor QN22 are shifted with the blocking signal BL and the complementary signal thereof CBL. Whenever the transfer gate TRS10 blocks the output data buffer circuit 114 from the complementary signal RWBSB of a data signal RWBS on the single data path 113, the first or second series combination allows the single data path 113 to go up or down depending upon the first diagnosis signal TFAIL1. On the other hand, if the transfer gate TRS10 is conductive, the complementary data signal RWBSB reaches the OR gate OR1 and the inverter circuit INV21 which supplies the data signal RWBS to the other OR gate OR2. Thus, the OR gates OR1 and OR2 are supplied in parallel with the data signal RWBS and the complementary data signal RWBSB, and these data signal and the complementary data signal are relayed through the NAND gates NA23 and NA24 to the output data buffer circuit 114. The OR gates OR1 and OR2 and the NAND gates NA21 and NA22 are respectively supplied with state controlling signals DA1 and DA2, and the state controlling signals DA1 and DA2 are produced by the controlling unit 112.

Figure 6:
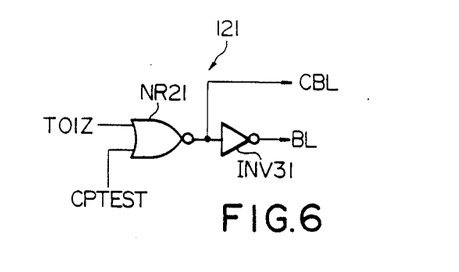
FIG. 6 is a logic diagram showing the arrangement of a blocking signal producing circuit incorporated in the semiconductor device shown in FIG. 5.
Figure 7:
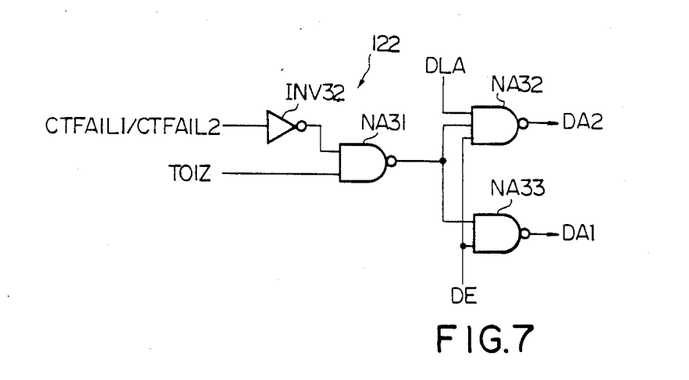
FIG. 7 is a logic diagram showing the arrangement of a three state control signal producing circuit incorporated in the semiconductor device shown in FIG. 5.

The controlling unit 112 includes a blocking signal producing circuit 121 illustrated in FIG. 6 and a state controlling signal producing circuit 122 illustrated in FIG. 7, and is supplied with various external signals as well as the complementary signal CTFAIL1 or CTFAIL2 of the first or second diagnosis signal TFAIL1 or TFAIL2.

Turning to FIG. 6, the blocking signal producing circuit 121 comprises a NOR gate NR21 and an inverter circuit INV31, and a function signal TOIZ indicative of either basic or three state testing function and the complementary signal CPTEST of a testing signal PTEST are fed to the NOR gate NR21. When the semiconductor memory device enters the usual mode of operation, the testing signal PTEST goes down to the low voltage level, and, accordingly, the complementary testing signal CPTEST goes up to the high voltage level, so that the NOR gate NR21 produces the complementary blocking signal CBL of the low voltage level. The inverter circuit INV31 produces the blocking signal BL of the high voltage level. With the blocking signal and the complementary signal thereof, the transfer gate TRS10 is kept conductive, so that the complementary data bit RWBSB passes the transfer gate TRS10 and reaches the OR gate OR1 and the inverter circuit INV21. However, if the test mode of operation is requested by changing the testing signal PTEST into the high voltage level, the complementary testing signal CPTEST of the low voltage level activates the NOR gate NR21. In this situation, the blocking signal BL shifts the voltage level either high or low depending upon the function signal TOIZ. Namely, if the function signal TOIZ is in the low voltage level and indicative of the basis testing function, the NOR gate NR21 yields the complementary blocking signal of the high voltage level, and the inverter circuit INV31 allows the blocking signal BL to go down to the low voltage level. Then, the transfer gate TRS10 blocks the complementary data bit RWBSB, and the p-channel type and the n-channel type field effect transistors QP23 and QN22 turn on to activate the first and second series combinations. As described hereinbefore, the first diagnosis signal TFAIL1 allows either p-channel or n-channel field effect transistor QP22 or QN23 to turn on, and, for this reason, the diagnosis signal decides the voltage level of the single data path 113. On the other hand, if the function signal TOIZ goes up to the high voltage level indicative of the three state testing function, the NOR gate NR21 yields the complementary blocking signal CBL of the low voltage level, and the blocking signal BL goes up to the high voltage level, so that the transfer gate TRS10 becomes conductive but the first and second series combinations are deactivated. In this situation, the output data signal Dout reaches the node Nin.

Turning to FIG. 7, the state controlling signal producing circuit 122 comprises an inverter circuit 122 and three NAND gates NA31, NA32 and NA33. When the function signal TOIZ goes up to the high voltage level and is indicative of the three state testing function, the NAND gate NA31 is activated and responsive to the first or second diagnosis signal TFAIL1 or TFAIL2 fed from the inverter circuit INV32. However, if the function signal TOIZ remains in the low voltage level indicative of the basic testing function, the NAND gate NA31 produces the output signal of the high voltage level regardless of the first or second diagnosis signal TFAIL1 or TFAIL2. The three state controlling signals DA1 and DA2 are produced by the NAND gates NA32 and NA33 depending upon the output signal of the NAND gate NA31, a timing control signal DLA and an output enable signal OE. Detailed circuit behavior is described hereinbelow with reference to FIGS. 8 and 9.

Figure 8:
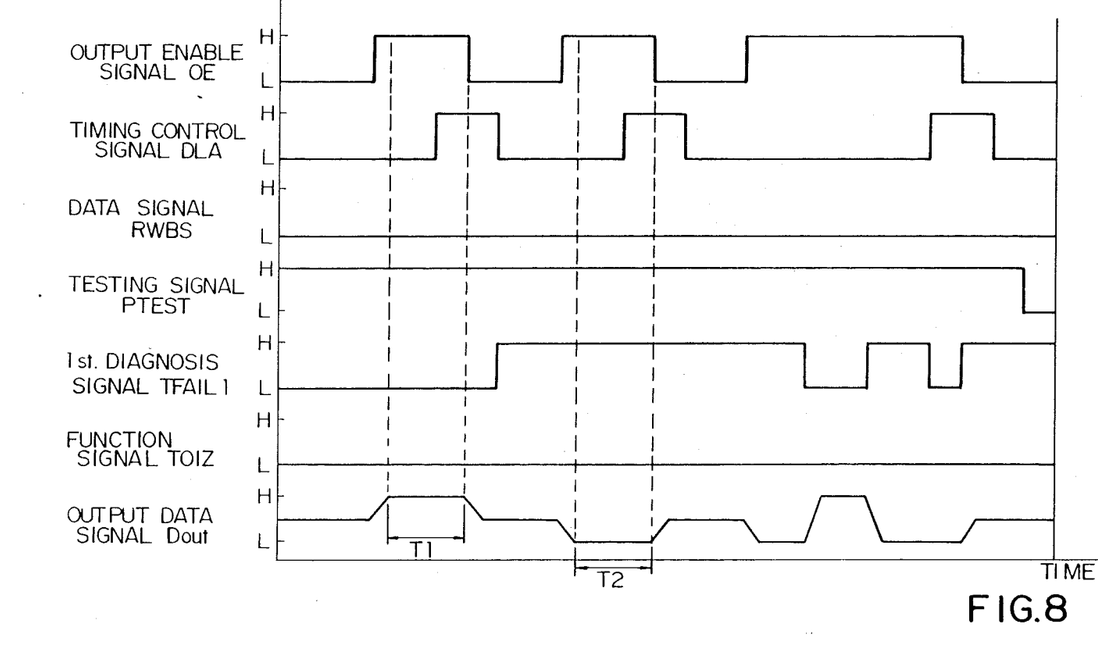
FIG. 8 is a diagram showing the waveforms of essential signals produced in the semiconductor memory device for a basic testing function.

The basic testing function is illustrated in FIG. 8. Assuming now that the basic testing function is requested with the function signal TOIZ of the low voltage level and the testing signal PTEST of the high voltage level, the transfer gate TRS10 turns off, and the first and second series combination are activated as described hereinbefore. If all of the data bits read out from the memory cell array 102 to the diagnostic unit 111 are consistent with each other as in a first time period T1, the first diagnosis signal TFAIL1 goes down to the low voltage level, and the complementary diagnosis signal CTFAIL1 allows the n-channel type field effect transistor QN23 to turn on, so that the node Nin is discharged to the ground level. The NAND gate NA31 produces the high voltage signal regardless of the first diagnosis signal TFAIL1, and the output enable signal OE remains in the high voltage level. This results in the three state controlling signal DA1 of the low voltage level. However, the three state controlling signal DA2 goes up to the high voltage level because the timing control signal DLA initially remains in the low voltage level. The low voltage level at the node Nin is directly supplied to the OR gate OR1, but the high voltage level is supplied through the inverter circuit INV21 to the OR gate OR2. These low and high voltage levels are relayed to the NAND gates NA21 and NA22, and cause the NAND gates NA21 and NA22 to produce the output signals of the high and low voltage levels, respectively. The flip flop circuit FF1 respectively supplies the high voltage signal and the low voltage signal to the inverter circuits INV22 and INV23 which in turn allow the n-channel type field effect transistor QN24 to turn on, keeping the n-channel type field effect transistor QN25 off. Then, the output data signal goes up to the high voltage level as shown in FIG. 8 and is indicative of the consistency of the data bits.

However, if the first diagnostic signal TFAIL1 goes up to the high voltage level in a time period T2 due to inconsistency of the data bits read out form the memory cell array 102. The node Nin goes up to the high voltage level because the n-channel type field effect transistor QP22 turns on. The three state controlling signals DA1 and DA2 are similar to those in the time period T1, so that the output data signal Dout goes down to the low voltage level indicative of the inconsistency.

Figure 9:
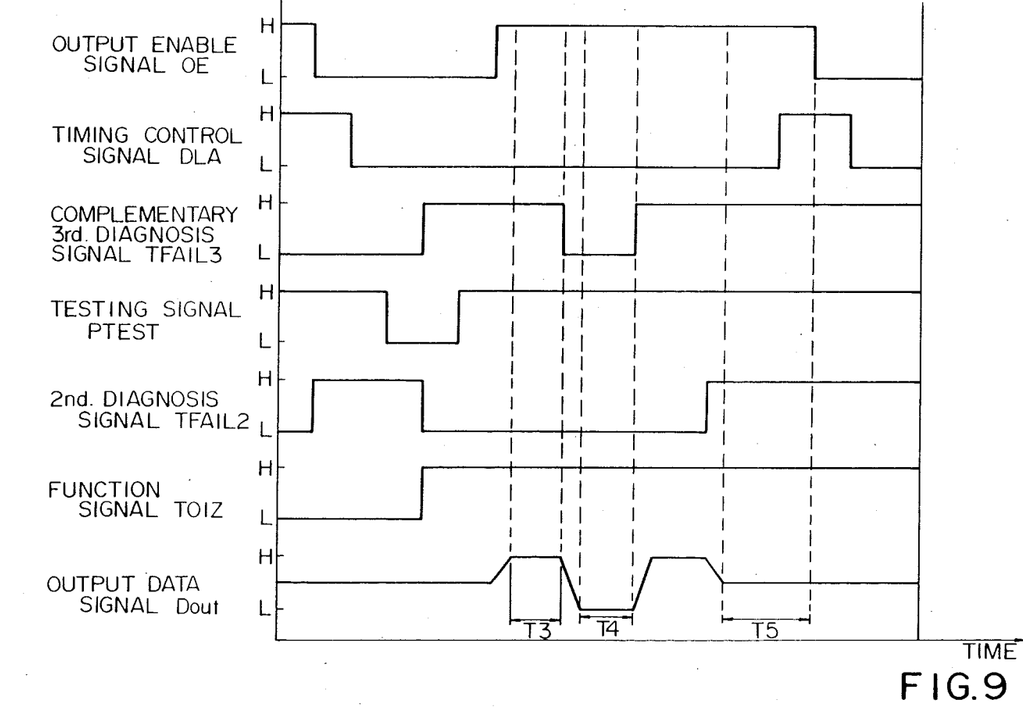
FIG. 9 is a diagram showing the waveforms of the essential signals for a three state testing function.

If the three state testing function starts with the function signal TOIZ and the testing signal both in the high voltage level as shown in FIG. 9. Assuming now that a plurality of data bits concurrently read out from the memory cell array 102 are consistent with one another in low level, the second diagnosis signal TFAIL2 goes down to the low voltage level but the third diagnosis signal TFAIL3 goes up to the high voltage level in time period T3. The blocking signal producing circuit 121 shifts the blocking signal BL into the high voltage level, and, for this reason, the transfer gate TRS10 turns on but the first and second series combinations are deactivated. Then, the complementary third diagnosis signal CTFAIL3 of the high voltage level passes through the transfer gate TRS10 and reaches the OR gate OR1 and the inverter circuit INV21. Since the second diagnosis signal TFAIL2 is in the low voltage level, the NAND gate NA31 yields the high voltage level, the NAND gates NA32 and NA33 respectively produce the three state controlling signals DA2 of the high voltage level and DA3 of the low voltage level. Then, the OR gates OR1 and OR2 supply the high voltage level and the low voltage level to the NAND gates NA21 and NA24, respectively, and the NAND gates NA21 and NA22 respectively supply the low voltage signal and the high voltage signal to the flip flop circuit FF1. The flip flop circuit FF1 supplies the high voltage signal and the low voltage signal to the inverter circuits INV22 and INV23, respectively, and the inverter circuits INV22 and INV23 cause the n-channel type field effect transistors QN24 and QN25 to turn off and on, respectively. Then, the output data pin Pout is coupled to the ground node through the n-channel type field effect transistor QN25, and, for this reason, the output data signal Dout goes down to the low voltage level indicative of the consistency in the low level.

If the data bits concurrently read out from the memory cell array 102 are consistent with one another in the high level, the third diagnosis signal TFAIL goes up to the high voltage level, and the complementary third diagnosis signal CTFAIL goes down to the low voltage level as in a time period T4. The blocking signal BL and the three state controlling signals DA1 and DA2 are identical in the voltage level with those in the time period T3, and, for this reason, the complementary third diagnosis signal TFAIL3 results in the output data signal Dout of the high voltage level.

However, if there is found any inconsistency, the second diagnosis signal TFAIL2 goes up to the high voltage level as in a time period T5. When the second diagnosis signal TFAIL2 is in the high voltage level, the NAND gate NA31 yields the low voltage signal, and the NAND gate NA33 produces the three state controlling signal DA1 of the high voltage level. The OR gates OR1 and OR2 relay the three state controlling signal DA1 to the NAND gates NA21 and NA22, and the flip flop circuit FF1 supplies the high voltage signals to the inverter circuits INV22 and INV23. Since the low voltage signals are simultaneously supplied to the n-channel type field effect transistors QN24 and QN25, the output inverter circuit INV24 causes the output data pin Pout to enter the high impedance state.

Thus, the single data path 113 is shared between the data signal RWSB and the third diagnosis signal TFAIL3, and, no complicate multiplexer is provided in association with the output buffer circuit 114. This results in a simple circuit arrangement which is conducive to reduction in the occupation area of the semiconductor memory device.

Second Embodiment

Figure 10:
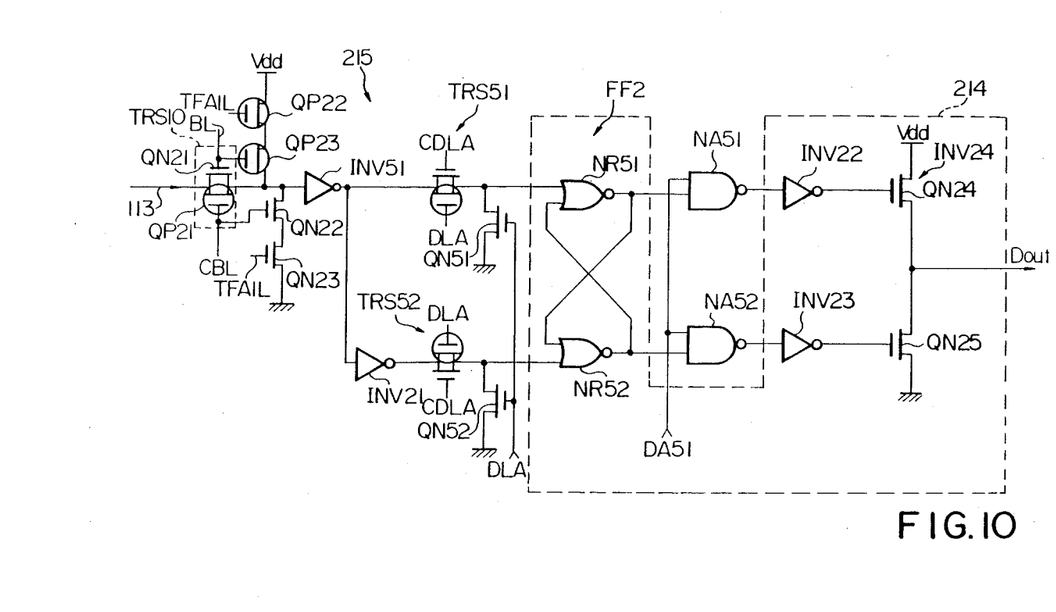
FIG. 10 is a circuit diagram showing the arrangement of another output buffer unit associated with an auxiliary gate controlling circuit according to the present invention.

Turning to FIG. 10 of the drawings, another output data buffer unit associated with an auxiliary gate controlling unit is illustrated. The component gates and transistors shown in FIG. 10 are labeled with the same reference marks for the sake of simplicity.

The output data buffer circuit 214 is similar to the output data buffer circuit 114, but the NAND gates NA23 and NA24 are replaced with NOR gates NR51 and NR52. However, the auxiliary gate control unit 215 is different from the auxiliary gate control unit 115. Namely, the auxiliary gate control unit 215 comprises the first and second series combinations, the inverter circuit INV21, another inverter circuit INV51, two transfer gates TRS51 and TRS52, two discharging transistors QN51 and QN52 and two NAND gates NA51 and NA52. The transfer gates TRS51 and TRS52 and the discharging transistors QN51 and QN52 form in combination a discharging circuit for providing the ground voltage level to the flip flop circuit FF2.

Figure 11:
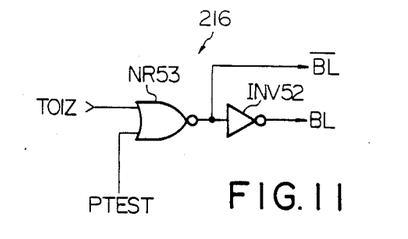
FIG. 11 is a logic diagram showing a part of a controlling unit associated with the auxiliary gate controlling circuit shown in FIG. 10.

The transfer gate TRS10 and the first and second series combinations behaves in a similar manner to those of the auxiliary gate control unit 115. The blocking signal BL and the complementary blocking signal CBL are produced by a blocking signal producing circuit 216 which comprises a NOR gate NR53 and an inverter circuit INV52 as shown in FIG. 11. However, the high impedance state indicative of the inconsistency is achieved by the NAND gates NA51 and NA52.

Figure 12:
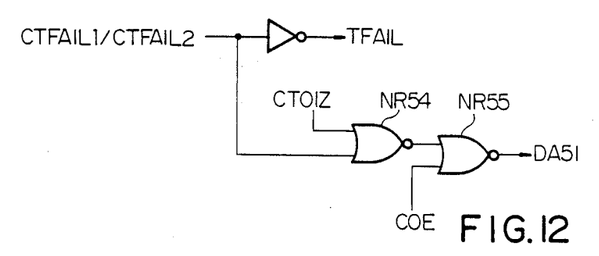
FIG. 12 is a logic diagram showing the arrangement of another part of the controlling unit.

Turning to FIG. 12 of the drawings, a NOR gate NR54 is supplied with the complementary function signal CTOIZ and the complementary third diagnosis signal CTFAIL, and a NOR gate NR55 is supplied with the output signal of the NOR gate NR54 and the complementary output enable signal COE. When a plurality of data bits concurrently read out from the memory cell array are inconsistent with one another, the third diagnosis signal TFAIL3 goes up to the high voltage level and, accordingly, the complementary signal thereof goes down to the low voltage level. In the three state testing function, the function signal is in the high voltage level and the complementary signal thereof is in the low voltage level. Then, the NOR gate NR54 yields the high voltage signal, and the NOR gate NR55 produces the three state controlling signal DA51 of the low voltage signal in the presence of the complementary output enable signal of the low voltage level. With the three state controlling signal of the high voltage level, both of the NAND gates NA51 and NA52 produces the output signals of the high voltage level which are inverted to the low voltage signals for allowing the n-channel type field effect transistors QN24 and QN25 to turn off. Then, the output data pin enters in the high impedance state. Other circuit behaviors are similar to those of the first embodiment, so that no further description is incorporated. The timing charts shown in FIGS. 8 and 9 are applicable to the second embodiment.

Third Embodiment

Figure 13:
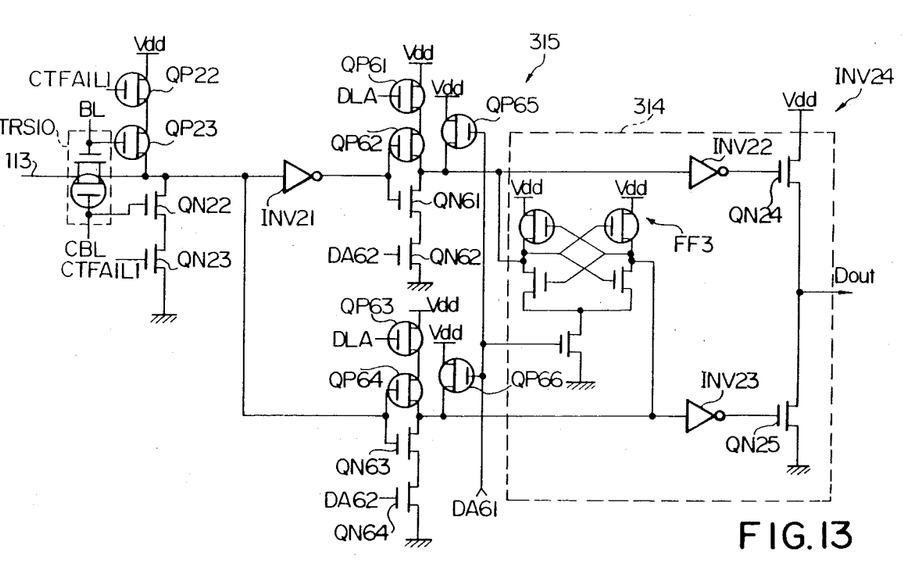
FIG. 13 is a circuit diagram showing the arrangement of still another output buffer unit associated with an auxiliary gate controlling circuit according to the present invention.

Turning to FIG. 13 of the drawings, still another output data buffer unit 314 comprises a flip flop circuit FF3, two inverter circuits INV22 and INV23 and an output inverter circuit INV24. The corresponding circuits and transistors are designated by the same reference marks used in FIG. 5. An auxiliary gate controlling unit 315 comprises the first and second series combinations, the inverter circuit INV21, a third series combination of p-channel type field effect transistors QP61 and QP62 and n-channel type field effect transistors QN61 and QN62, a fourth series combination of p-channel type field effect transistors QP63 and QP64 and n-channel type field effect transistors QN63 and QN64, and two charging transistors QP65 and QP66.

Figure 14:
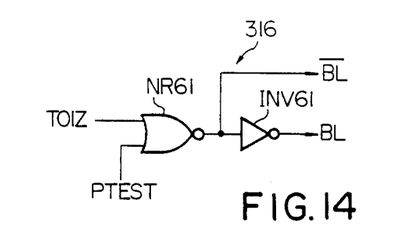
FIG. 14 is a logic diagram showing a part of a controlling unit associated with the auxiliary gate controlling circuit shown in FIG. 13.

The blocking signal BL and the complementary blocking signal CBL are produced by a blocking signal producing circuit 316 shown in FIG. 14, and the blocking signal producing circuit 316 comprises a NOR gate NR61 and the circuit INV61. The blocking signal BL and the complementary blocking signal CBL achieve the same shifting operation as that of the first embodiment, so that no further description is incorporated.

Figure 15:
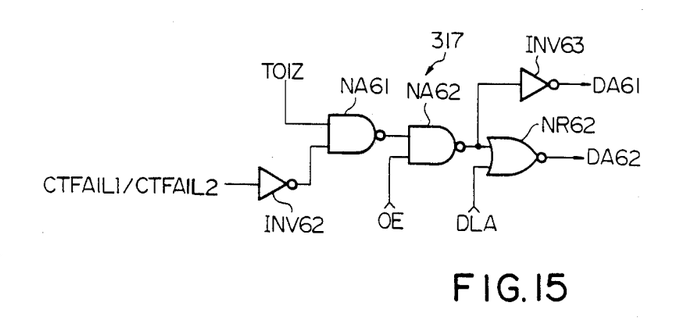
FIG. 15 is a logic diagram showing the arrangement of another part of the controlling unit.

The third and fourth series combinations and the charging transistors QP65 and QP66 are gated by three state controlling signals DA61 and Da62, and the three state controlling signals DA61 and DA62 are produced by a three state control signal producing circuit 317 illustrated in FIG. 15. The three state control signal producing circuit 317 comprises two inverter circuits INV62 and INV63, two NAND gates NA61 and NA62 and a NOR gate NR62. If a plurality of data bits concurrently read out from the memory cell array contain at least one data bit different in logic level from the other data bits, the third diagnosis signal TFAIL3 goes up to the high voltage level, and the NAND gate NA61 produces the low voltage signal which allows the NAND gate NA62 to yield the high voltage signal in the presence of the output enable signal of the high voltage level. Then, the three state control signal DA61 goes down to the low voltage level, so that the charging transistors QP65 and QP66 turn on and the flip flop circuit FF3 is deactivated. Then, high voltage signals are supplied to the inverter circuits INV22 and INV23, and the inverter circuits INV22 and INV23 causes the n-channel type field effect transistors QN24 and QN25 to turn off, thereby allowing the output inverter circuit INV24 to enter the high impedance state. Other circuit behaviors are similar to those of the first embodiment, so that no detailed description is incorporated. The timing charts shown in FIGS. 8 and 9 are applicable to the third embodiment.

Although particular embodiments of the present invention have been shown and described, it will be obvious to those skilled in the art that various changes and modifications may be made without departing from the spirit and scope of the present invention.

What is claimed is:

1. A semiconductor memory device fabricated on a single semiconductor chip and having a usual access mode and a testing mode of operation, comprising:
   (a) a memory cell unit storing a plurality of data bits one of which is read out in said usual access mode of operation and plural bits of which are read out in said testing mode of operation;
   (b) a diagnostic unit activated in said testing mode of operation and achieving a basic testing function and a three state testing function, said diagnostic unit producing a first diagnosis signal of a first level when said plural data bits are consistent with one another in said basic testing function, said first diagnosis signal being shifted to a second level when at least one of said plural data bits is different from the other data bits, said diagnostic unit further producing a second diagnostic signal of either first or second level in said three state testing function when said plural data bits are consistent with one another in said first or second level, said diagnostic unit further producing a third diagnosis signal of said second level in said three state testing function when at least one of said plural data bits is different from the other data bits;
   (c) an output data buffer unit coupled to an output data pin and causing said output data pin to shift between said first level and said second level depending upon said data bit in said usual access mode or upon said first diagnosis signal, said output data buffer circuit further causing said output data pin to shift between said first level, said second level and a high impedance state depending upon a combination of said second and third diagnosis signals;
   (d) a single data path coupled between said memory cell unit, said diagnostic unit and said output data buffer unit for propagating said data bit in said usual access mode and said third diagnostic signal in said testing mode for achieving said three state testing function;
   (e) a controlling unit supplied with said first and second diagnostic signals and with other external control signals and producing a blocking signal and first and second three state controlling signals;
   (f) a transfer gate intervening in said single data path and turning off in the presence of said blocking signal in said testing mode for achievement of said basic testing mode, said transfer gate turning on in said usual access mode and in said testing mode for achieving said three state testing function; and
   (g) an auxiliary gate control unit responsive to said first and second state controlling signals and forcibly steering said output data buffer circuit in said testing mode for shifting said output data pin.

2. A semiconductor memory device as set forth in claim 1, in which said output data buffer unit comprises first and second NAND gates each having an output node coupled to an input node of the other NAND gate, first and second inverter circuits respectively coupled to the output nodes of said first and second NAND gates and an output inverter circuit implemented by a series combination of two field effect transistors of a first channel conductivity type coupled between first and second sources of voltage level different in voltage level.

3. A semiconductor memory device as set forth in claim 2, in which said controlling unit has a blocking signal producing circuit operative to produce a blocking signal in said testing mode for achieving said basic testing function and a state controlling signal producing circuit for producing said three state controlling signals.

4. A semiconductor memory device as set forth in claim 3, in which said blocking signal producing circuit has a first NOR gate supplied with two of said external control signals and a third inverter circuit coupled to said first NOR gate, and in which said third inverter circuit produces said blocking signal and said third NOR gate produces the complementary signal of the blocking signal.

5. A semiconductor memory device as set forth in claim 4, in which said three state controlling signal producing circuit comprises a fourth inverter circuit supplied with either first or second diagnosis signal, a third NAND gate coupled at one input node thereof to the output node of the fourth inverter circuit and supplied at the other input node thereof with one of said external control signal indicative of either basic or three state testing function, a third NAND gate coupled at one input node thereof to the output node of said third NAND gate and supplied at the other input nodes thereof with a timing control signal and another external control signal for producing said second three state controlling signal, and a fourth NAND gate coupled at one input node thereof to the output node of the third NAND gate and supplied at the other input node thereof with said another external control signal for producing said first three state controlling signal.

6. A semiconductor memory device as set forth in claim 5, in which said auxiliary gate control unit comprises a first series combination of field effect transistors of a second channel conductivity type respectively supplied with said blocking signal and the complementary signal of said first diagnosis signal and coupled between said first source of voltage level and said single data path, a second series combination of field effect transistors of said first channel conductivity type respectively supplied with the complementary blocking signal and the first diagnosis signal and coupled between said single data path and said second source of voltage level, a fifth inverter circuit coupled at the input node thereof to said single data path, a first OR gate coupled at one input node thereof to the single data path and supplied at the other input node thereof with said first three state controlling signal, a second OR gate coupled at one input node thereof to said fifth inverter circuit and supplied at the other input node thereof with the first three state controlling signal, a sixth NAND gate coupled at one input node thereof to the output node of the first OR gate and supplied at the other input node thereof with said second three state controlling signal, and a seventh NAND gate coupled at one input node thereof to the output node of the second OR gate and supplied at the other input node thereof with the second three state controlling signal.

7. A semiconductor memory device as set forth in claim 1, in which said output data buffer unit comprises second and third NOR gates each having an output node coupled to an input node of the other NOR gate, sixth and seventh inverter circuits respectively associated with the second and third NOR gates and an output inverter circuit implemented by a series combination of two field effect transistors of said first channel conductivity type coupled between said first and second sources of voltage level.

8. A semiconductor memory device as set forth in claim 7, in which said controlling unit has a blocking signal producing circuit operative to produce a blocking signal in said testing mode for achieving said basic testing function and a state controlling signal producing circuit for producing said three state controlling signals.

9. A semiconductor memory device as set forth in claim 8, in which said blocking signal producing circuit has a fourth NOR gate supplied with two of said external control signals and an eighth inverter circuit coupled to said first NOR gate, and in which said eighth inverter circuit produces said blocking signal and said fourth NOR gate produces the complementary signal of the blocking signal.

10. A semiconductor memory device as set forth in claim 9, in which said three state controlling signal producing circuit comprises a ninth inverter circuit supplied with either first or second diagnosis signal, a fifth NOR gate supplied at one input node thereof with the complementary signal of either first or second diagnosis signal and at the other input node thereof with the complementary signal of one of said external control signal indicative of either basic or three state testing function, and a sixth NOR gate coupled at one input node thereof to the output node of said fifth NAND gate and supplied at the other input node thereof with the complementary signal of one of said external control signal for producing said first and second three state controlling signals, said second three state controlling signal being the complementary signal of said first three state controlling signal.

11. A semiconductor memory device as set forth in claim 10, in which said auxiliary gate control unit comprises a first series combination of field effect transistors of a second channel conductivity type respectively supplied with said blocking signal and said first diagnosis signal and coupled between said first source of voltage level and said single data path, a second series combination of field effect transistors of said first channel conductivity type respectively supplied with the complementary blocking signal and the first diagnosis signal and coupled between said single data path and said second source of voltage level, a tenth inverter circuit coupled at the input node thereof to said single data path, an eleventh inverter circuit coupled at the input node thereof to the output node of the tenth inverter circuit, a second transfer gate responsive to a timing control signal and coupled between the tenth inverter circuit and said second NOR gate, a third transfer gate responsive to the timing control signal and coupled between the eleventh inverter circuit and said third NOR gate, an eighth NAND gate coupled at one input node thereof to the output node of the second NOR gate and supplied at the other input node thereof with said first or second three state controlling signal, and a ninth NAND gate coupled at one input node thereof to the output node of the third NOR gate and supplied at the other input node thereof with the first or second three state controlling signal.

12. A semiconductor memory device as set forth in claim 1, in which said output data buffer unit comprises a flip flop circuit of a sense amplifier type, twelfth and thirteenth inverter circuits coupled to the flip flop circuit and an output inverter circuit implemented by a series combination of two field effect transistors of said first channel conductivity type coupled between said first and second sources of voltage level.

13. A semiconductor memory device as set forth in claim 12, in which said controlling unit has a blocking signal producing circuit operative to produce a blocking signal in said testing mode for achieving said basic testing function and a state controlling signal producing circuit for producing said three state controlling signals.

14. A semiconductor memory device as set forth in claim 13, in which said blocking signal producing circuit has a seventh NOR gate supplied with two of said external control signals and a fourteenth inverter circuit coupled to said first NOR gate, and in which said fourteenth inverter circuit produces said blocking signal and said seventh NOR gate produces the complementary signal of the blocking signal.

15. A semiconductor memory device as set forth in claim 14, in which said three state controlling signal producing circuit comprises a fifteenth inverter circuit supplied with the complementary signal of either first or second diagnosis signal, a tenth NAND gate coupled at one input node thereof to the output node of the fifteenth inverter circuit and supplied at the other input node thereof with one of said external control signals indicative of either basic or three state testing function, a eleventh NAND gate coupled at one input node thereof to the output node of the tenth NAND gate and supplied at the other input node thereof with another external control signal, an eighth NOR gate coupled at one input node thereof to the output node of the eleventh NAND gate and supplied at the other input node thereof with a timing control signal for producing said second three state controlling signal, and a sixteenth inverter circuit coupled at the input node thereof to the output node of said eleventh NAND gate for producing said first three state controlling signal.

16. A semiconductor memory device as set forth in claim 15, in which said auxiliary gate control unit comprises a first series combination of field effect transistors of a second channel conductivity type respectively supplied with said blocking signal and the complementary signal of said first diagnosis signal and coupled between said first source of voltage level and said single data path, a second series combination of field effect transistors of said first channel conductivity type respectively supplied with the complementary blocking signal and the complementary signal of the first diagnosis signal and coupled between said single data path and said second source of voltage level, a third series combination of field effect transistors of said second channel conductivity type respectively supplied with the output signal of the seventeenth inverter circuit and a timing control signal and coupled between the first source of voltage level and a first input node of said flip flop circuit, a fourth series combination of field effect transistors of said first channel conductivity type respectively supplied with the output signal of the seventeenth inverter circuit and said second three state controlling signal and coupled between said first input node of the flip flop circuit, a fifth series combination of the second channel conductivity type respectively supplied with an input signal of the seventeenth inverter circuit and the timing control signal and coupled between a second input node of the flip flop circuit and the first source of voltage level, a sixth series combination of field effect transistors of the first channel conductivity type respectively supplied with the input signal and the second three state controlling signal and coupled between the second input node and the second source of voltage level, a first charging transistor responsive to said first three state controlling signal and coupled between the first source of voltage level and the first input node of the flip flop circuit, and a second charging transistor responsive to the first three state controlling signal and coupled between the first source of voltage level and the second input node of the flip flop circuit.

* * * * *

UNITED STATES PATENT AND TRADEMARK OFFICE
CERTIFICATE OF CORRECTION

PATENT NO. : 4,982,380
DATED : January 1, 1991
INVENTOR(S) : Hiroyuki KOIKE It is certified that error appears in the above-identified patent and that said Letters Patent is hereby corrected as shown below:

ON TITLE PAGE:    ITEM [30]
    Priority Data, delete "64-45825" and insert
    --1-45825--

Signed and Sealed this

Fourth Day of August, 1992

*Attest:*

DOUGLAS B. COMER

*Attesting Officer*      *Acting Commissioner of Patents and Trademarks*